(12) United States Patent
Horita

(10) Patent No.: US 10,340,874 B2
(45) Date of Patent: Jul. 2, 2019

(54) FILTER CIRCUIT, RF FRONT END CIRCUIT, AND COMMUNICATION APPARATUS

(71) Applicant: Murata Manufacturing Co., Ltd., Kyoto (JP)

(72) Inventor: Atsushi Horita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 61 days.

(21) Appl. No.: 15/583,198

(22) Filed: May 1, 2017

(65) Prior Publication Data
US 2017/0302243 A1 Oct. 19, 2017

Related U.S. Application Data

(63) Continuation of application No. PCT/JP2015/079769, filed on Oct. 22, 2015.

(30) Foreign Application Priority Data

Nov. 11, 2014 (JP) ................................ 2014-229086

(51) Int. Cl.
H03H 7/12 (2006.01)
H03H 7/01 (2006.01)
(Continued)

(52) U.S. Cl.
CPC ................ *H03H 7/12* (2013.01); *H01P 1/20* (2013.01); *H03H 7/09* (2013.01); *H03H 7/1758* (2013.01);
(Continued)

(58) Field of Classification Search
CPC ...... H03H 7/1775; H03H 9/6403; H03H 9/58; H03H 7/1758; H03H 7/09; H03H 7/12;
(Continued)

(56) References Cited

U.S. PATENT DOCUMENTS 5,528,581 A 6/1996 De Bot
2002/0105391 A1 8/2002 Yamada
2011/0028180 A1 2/2011 Sawai

FOREIGN PATENT DOCUMENTS

JP S62-76914 A 4/1987
JP S63-30003 A 2/1988
(Continued)

OTHER PUBLICATIONS

Machine English Translation of JPS6276914A published on Apr. 9, 1987.*
(Continued)

*Primary Examiner* — Robert J Pascal
*Assistant Examiner* — Jorge L Salazar, Jr.
(74) *Attorney, Agent, or Firm* — Pearne & Gordon LLP

(57) ABSTRACT

A filter circuit is provided which allows the pass band to be tuned to a desired communication signal while achieving increased attenuation in a given frequency band that lies outside the pass band. A filter circuit includes a fixed filter and a tunable filter. The fixed filter has a pass band wider than a frequency band corresponding to a predetermined communication signal and overlapping with the frequency band corresponding to the communication signal. The tunable filter has a stop band narrower than the pass band of the fixed filter and having tunable frequency. The fixed filter and the tunable filter are connected in series.

17 Claims, 8 Drawing Sheets

(51) Int. Cl.
*H01P 1/20* (2006.01)
*H03H 7/46* (2006.01)
*H03H 9/64* (2006.01)
*H03H 7/09* (2006.01)
*H03H 9/58* (2006.01)
*H03H 9/02* (2006.01)

(52) U.S. Cl.
CPC ............ *H03H 7/1775* (2013.01); *H03H 7/46* (2013.01); *H03H 9/58* (2013.01); *H03H 9/64* (2013.01); *H03H 9/6403* (2013.01); *H03H 2009/02204* (2013.01); *H03H 2250/00* (2013.01)

(58) Field of Classification Search
CPC .. H03H 9/64; H03H 7/46; H03H 2009/02204; H03H 2250/00; H01P 1/20
USPC ................. 333/133, 167, 176, 187, 193–196
See application file for complete search history.

(56) References Cited

FOREIGN PATENT DOCUMENTS

| | | |
|---|---|---|
| JP | H01-238321 A | 9/1989 |
| JP | H05-327400 A | 12/1993 |
| JP | H06-232793 A | 8/1994 |
| JP | 2002-009505 A | 1/2002 |
| JP | 2009-130831 A | 6/2009 |
| JP | 2011-050033 A | 3/2011 |
| JP | 2013-090165 A | 5/2013 |

OTHER PUBLICATIONS

International Search Report issued in Application No. PCT/JP2015/079769 dated Nov. 24, 2015.
Written Opinion issued in Application No. PCT/JP2015/079769 dated Nov. 24, 2015.

* cited by examiner

FILTER CIRCUIT, RF FRONT END CIRCUIT, AND COMMUNICATION APPARATUS This is a continuation of International Application No. PCT/JP2015/079769 filed on Oct. 22, 2015 which claims priority from Japanese Patent Application No. 2014-229086 filed on Nov. 11, 2014. The contents of these applications are incorporated herein by reference in their entireties.

BACKGROUND

Technical Field

The present disclosure relates to a filter circuit with tunable bandpass characteristics, an RF front end circuit including the filter circuit, and a communication apparatus including the RF front end circuit.

To handle communication signals in different frequency bands, a front end circuit in a communication apparatus often includes filters adapted to each individual communication signal (see, for example, Patent Document 1). This requires use of a large number of filters to handle a large number of communication signals, leading to increased complexity and scale of the front end circuit. Accordingly, to minimize increases in the circuit scale of such a front end circuit, a tunable filter with tunable filter characteristics is often used in the front end circuit (see, for example, Patent Document 2).

Various techniques are currently being developed to make effective use of frequency bands used for radio communication. For example, Patent Document 3 describes a system designed for radio communication utilizing TV white spaces.

Radio communication utilizing TV white spaces involves freeing-up of frequency bands hitherto used for television broadcasting, and use of the frequency bands for radio communication, with free channels (free communication channels) not used by television broadcasting being used for radio communication. A radio communication device performs radio communication by using a free communication channel in the communication band used for television broadcasting, which is assigned by a database.

Patent Document 1: Japanese Unexamined Patent Application Publication No. 6-232793
Patent Document 2: Japanese Unexamined Patent Application Publication No. 2009-130831
Patent Document 3: Japanese Unexamined Patent Application Publication No. 2013-90165

BRIEF SUMMARY

Although tunable filters according to related art allow their filter characteristics to be adjusted so as to tune the pass band to the frequency band corresponding to a desired communication signal, these tunable filters do not necessarily allow attenuation to be adjusted to a required level in a frequency band adjacent to the pass band.

For example, with radio communication systems utilizing TV white spaces, multiple communication channels in a specific frequency band used by such a system lie in very close frequency ranges. For this reason, a tunable filter (antenna tuner) used in such a radio communication system utilizing TV white spaces needs to achieve high levels of attenuation in communication channels adjacent to the communication channel being selected. Unfortunately, such attenuation characteristics are difficult to achieve with tunable filters according to related art.

Accordingly, the present disclosure provides a filter circuit, an RF front end circuit, and a communication apparatus that allow for tuning of the pass band to a desired communication signal while achieving increased attenuation in a frequency band adjacent to the pass band.

A filter circuit according to the present disclosure includes a fixed filter having a pass band that overlaps with a frequency band corresponding to a predetermined communication signal, and a tunable filter having a stop band that is frequency-tunable, the stop band having a frequency tuning range that covers a frequency band adjacent to the frequency band corresponding to the predetermined communication signal. The fixed filter and the tunable filter are connected in series.

This configuration allows the pass band of the filter circuit to be tuned to the frequency band of a predetermined communication signal, while achieving increased attenuation in a frequency band adjacent to the above-mentioned frequency band. For example, if the filter circuit is connected to a non-linear element such as an amplifier, distortion of the communication signal caused by the non-linear element causes the distortion components of the communication signal to be superimposed on a frequency band adjacent to the frequency band of the predetermined communication signal. However, adjusting the stop band of the tunable filter as described above enables sufficient attenuation of the distortion components in the filter circuit.

In an embodiment of the filter circuit, the pass band of the fixed filter has a band width wider than the band width of the frequency band corresponding to the predetermined communication signal, and the stop band of the tunable filter has a band width narrower than the band width of the pass band of the fixed filter.

This configuration allows the wide-band characteristics of the fixed filter to be compensated for by the narrow-band characteristics of the tunable filter to readily achieve desired characteristics.

In an embodiment of the filter circuit, the tunable filter includes a first tunable filter and a second tunable filter, the first tunable filter has a stop band having a frequency tuning range that covers a frequency band located adjacent to and on the high frequency side of the frequency band corresponding to the predetermined communication signal, and the second tunable filter has a stop band having a frequency tuning range that covers a frequency band located adjacent to and on the low frequency side of the pass band of the fixed filter.

This configuration allows steepness to be increased on both the high and low frequency sides of the pass band of the filter circuit.

In an embodiment of the filter circuit, the first tunable filter has a steepness that is higher on the low frequency side of the stop band than on the high frequency side of the stop band, and the second tunable filter has a steepness that is higher on the high frequency side of the stop band than on the low frequency side of the stop band.

This configuration allows steepness to be further increased on both the high and low frequency sides of the pass band of the filter circuit.

In an embodiment of the filter circuit, the pass band of the fixed filter includes a frequency band corresponding to each of multiple communication signals, the stop band of the first tunable filter is frequency-tunable over a frequency band located adjacent to and on the high frequency side of the frequency band to which each of the communication signals corresponds, and the stop band of the second tunable filter is frequency-tunable over a frequency band located adjacent to and on the low frequency side of the frequency band to which each of the communication signals corresponds.

This configuration allows the pass band of the filter circuit to be switched to a frequency band corresponding to each communication signal by adjusting the first tunable filter and the second tunable filter. This helps to minimize increases in circuit scale even when the filter circuit needs to be adapted to a large number of communication signals.

In an embodiment of the filter circuit, the fixed filter includes multiple fixed filters having different pass bands, and the filter circuit further includes a switch that selects one of the fixed filters and connects the selected one of the fixed filters to the tunable filter.

This configuration allows the filter circuit to be adapted to an extremely large number of communication signals, and ensures an extremely wide frequency tuning range of the pass band of the filter circuit even when the band width of the pass band is extremely narrow.

In an embodiment of the filter circuit, the filter circuit is adapted to a system that performs radio communication of the communication signal by selecting a free channel from among multiple channels existing in a specific frequency band. In an embodiment of the filter circuit, the system is a radio communication system utilizing a TV white space, the specific frequency band is a frequency band used for television broadcasting, and each of the channels is a channel used for television broadcasting. In an embodiment of the filter circuit, the fixed filter has a pass band that extends over two or more channels, and the tunable filter is frequency-tunable within the pass band.

As a consequence, a communication signal in a channel selected within a specific frequency band is allowed to pass without necessarily being attenuated, while effectively attenuating a communication signal in a channel adjacent to that channel.

An RF front end circuit according to an embodiment of the present disclosure includes the filter circuit mentioned above, an antenna connection end located on one end side of the filter circuit, and a signal-processing-circuit connection end located on the other end side of the filter circuit.

A communication apparatus according to an embodiment of the present disclosure includes the RF front end circuit mentioned above, an antenna connected to the antenna connection end, and a signal processing circuit connected to the signal-processing-circuit connection end.

According to the present disclosure, a combination of a fixed filter and a tunable filter is used to set a frequency band corresponding to a predetermined communication signal as the pass band of a filter circuit, while achieving increased attenuation in a frequency band adjacent to the frequency band of the communication signal.

DETAILED DESCRIPTION

Figure 1A:
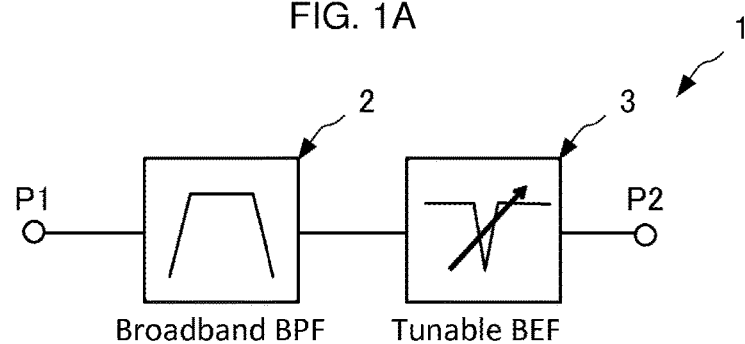
FIGS. 1A and 1B illustrate a block diagram and a schematic characteristics diagram of a filter circuit according to a first embodiment.

Hereinafter, embodiments of the present disclosure will be described by way of several specific examples with reference to the drawings. In the drawings, the same reference signs are used to designate the same portions. It is needless to mention that the embodiments are for illustrative purposes only, and components or elements described with reference to different embodiments may be partially substituted for or combined with each other.

First Embodiment

FIG. 1A is a block diagram of a filter circuit 1 according to a first embodiment of the present disclosure.

The filter circuit 1 includes a fixed filter 2 and a tunable filter 3. The fixed filter 2 is a filter with fixed frequency characteristics. The tunable filter 3 is a filter with tunable frequency characteristics. The fixed filter 2 and the tunable filter 3 are connected in series between a port P1 and a port P2. The fixed filter 2 and the tunable filter 3 may each be implemented as a filter such as an LC filter, a SAW filter, or a dielectric filter made up of a combination of an electrode pattern, a passive element, or other components. The tunable filter 3 may include a variable reactance element such as a variable capacitor.

Figure 1B:
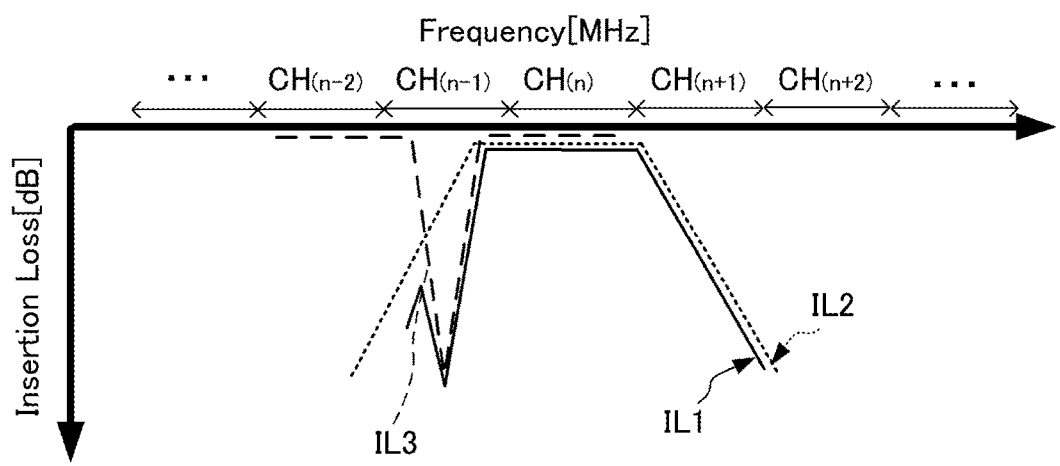

FIG. 1B is a bandpass characteristics diagram schematically illustrating the characteristics of the filter circuit 1 according to the first embodiment of the present disclosure. A solid line in FIG. 1B is a schematic representation of the bandpass characteristics IL1 of the filter circuit 1. A dotted line in FIG. 1B is a schematic representation of the bandpass characteristics IL2 of the fixed filter 2. A wavy line in FIG. 1B is a schematic representation of the bandpass characteristics IL3 of the tunable filter 3.

The following description assumes that the frequency band of a communication signal to which the filter circuit 1 is adapted is designed to lie adjacent to multiple frequency bands of other communication signals. Further, the following description will be directed to a case in which the n-th frequency band is selected from among multiple adjacent frequency bands by adjusting the tunable filter 3.

The bandpass characteristics IL2 of the fixed filter 2 feature a pass band having a band width substantially equal to or slightly wider than that of the n-th frequency band CH(n) and overlapping with the frequency band CH(n). The bandpass characteristics IL3 of the tunable filter 3 feature a stop band with tunable center frequency. The stop band in the bandpass characteristics IL3 is narrower in bandwidth than the pass band of the fixed filter 2, with the center frequency being adjustable in the vicinity of the pass band of the fixed filter 2.

The bandpass characteristics IL1 of the filter circuit 1 configured as described above feature a pass band tuned to the frequency band CH(n), while allowing for increased attenuation in a frequency band outside the frequency band CH(n) through adjustment of the tunable filter 3.

For example, in the example illustrated in FIG. 1B, the stop band of the tunable filter 3 has its center frequency adjusted such that the entire width of the stop band overlaps with a frequency band CH(n−1) that is adjacent to the frequency band CH(n). As a consequence, the steepness of the bandpass characteristics IL1 of the filter circuit 1 increases in the region from the frequency band CH(n) to the frequency band CH(n−1). The resulting bandpass characteristics IL1 feature a pass band tuned to the frequency band CH(n), while allowing for increased attenuation in the frequency band CH(n−1) adjacent to the frequency band CH(n).

Tuning the stop band of the tunable filter 3 to the frequency band adjacent to the pass band in this way has the following effect. That is, if a non-linear element such as an amplifier is connected to the filter circuit 1, and the communication signal in the frequency band CH(n) is distorted by the non-linear element to generate distortion components in the frequency band CH(n−1), such distortion components can be sufficiently attenuated by the filter circuit 1.

The filter circuit 1 according to the first embodiment can be configured as described above. Although the preceding description is directed to a case in which the pass band of the fixed filter 2 is set to be substantially equal in band width to the frequency band CH(n), the pass band of the fixed filter 2 may be significantly wider than the frequency band CH(n), or may extend over multiple frequency bands (channels). The configuration in this case may be such that instead of connecting only one tunable filter 3 to the fixed filter 2, multiple tunable filters are connected to the fixed filter 2, and the stop band of at least one tunable filter is tuned to a frequency band adjacent to the frequency band of the communication signal, with the stop bands of other tunable filters being tuned to spurious components generated within the pass band of the fixed filter 2.

Second Embodiment

Figure 2A:
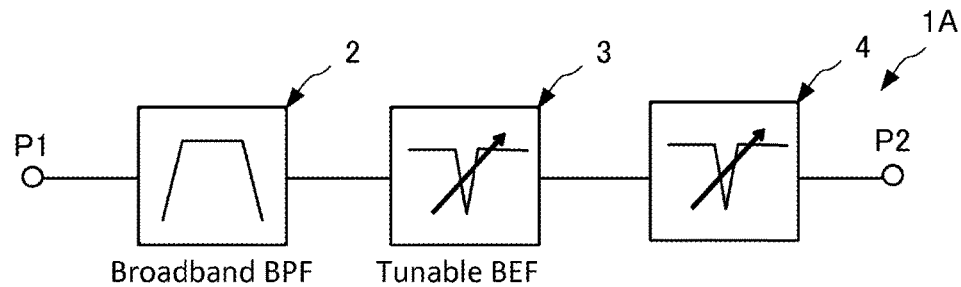
FIGS. 2A-2C illustrate a block diagram and a schematic characteristics diagrams of a filter circuit according to a second embodiment.

FIG. 2A is a block diagram of a filter circuit 1A according to a second embodiment of the present disclosure.

The filter circuit 1A includes a fixed filter 2, a first tunable filter 3, and a second tunable filter 4. The fixed filter 2, the first tunable filter 3, and the second tunable filter 4 are connected in series between a port P1 and a port P2.

Figure 2B:
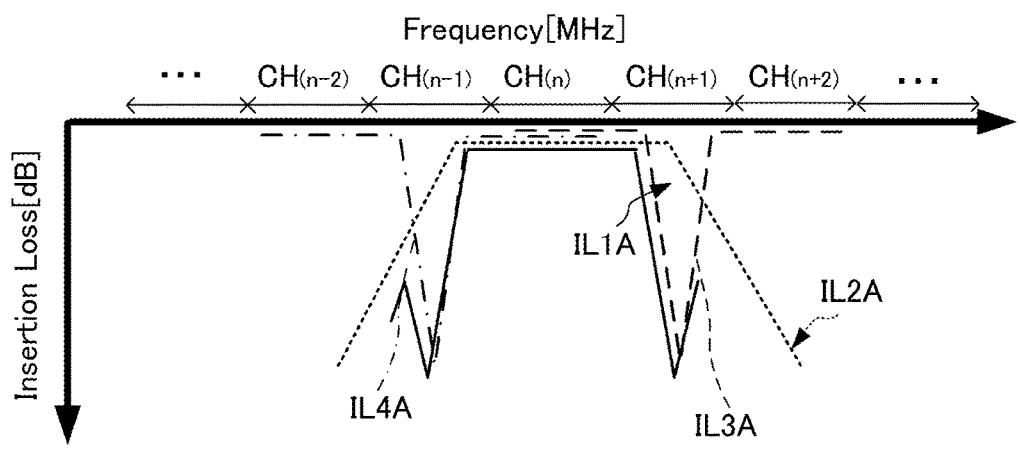

FIG. 2B is a bandpass characteristics diagram schematically illustrating the characteristics of the filter circuit 1A according to the second embodiment of the present disclosure. A solid line in FIG. 2B is a schematic representation of the bandpass characteristics IL1A of the filter circuit 1A. A dotted line in FIG. 2B is a schematic representation of the bandpass characteristics IL2A of the fixed filter 2. A wavy line in FIG. 2B is a schematic representation of the bandpass characteristics IL3A of the first tunable filter 3. An alternate long and short dashed line in FIG. 2B is a schematic representation of the bandpass characteristics IL4A of the second tunable filter 4.

The bandpass characteristics IL2A of the fixed filter 2 feature a pass band having a band width substantially equal to or slightly wider than that of the n-th frequency band CH(n) and overlapping with the frequency band CH(n). The bandpass characteristics IL3A of the first tunable filter 3 and the bandpass characteristics IL4A of the second tunable filter 4 each feature a stop band that is narrower than the pass band of the fixed filter 2 and whose center frequency is tunable. The stop band in the bandpass characteristics IL3A has a center frequency that is adjustable in the vicinity of the high frequency side of the pass band of the fixed filter 2, and the stop band in the bandpass characteristics IL4A has a center frequency that is adjustable in the vicinity of the low frequency side of the pass band of the fixed filter 2.

As in the first embodiment, the bandpass characteristics IL1A of the filter circuit 1A configured as described above also feature a pass band tuned to the frequency band CH(n), while allowing for increased attenuation in a frequency band outside the frequency band CH(n) through adjustment of the first tunable filter 3 or the second tunable filter 4.

For example, in the example illustrated in FIG. 2B, the stop band of the first tunable filter 3 has its center frequency adjusted such that the entire width of the stop band overlaps with a frequency band CH(n+1) located adjacent to and on the high frequency side of the frequency band CH(n). Further, the stop band of the second tunable filter 4 has its center frequency adjusted such that the entire width of the stop band overlaps with a frequency band CH(n−1) located adjacent to and on the low frequency side of the frequency band CH(n). The resulting bandpass characteristics IL1A of the filter circuit 1A feature a pass band tuned to the frequency band CH(n), while allowing for increased steepness in the region from the frequency band CH(n) to the frequency band CH(n−1) located on the low frequency side, as well as increased steepness in the region from the frequency band CH(n) to the frequency band CH(n+1) located on the high frequency side.

Tuning the stop bands of the first and second tunable filters 3 and 4 to the frequency bands located on the low and high frequency sides adjacent to the pass band as described above has the following effect. That is, if a non-linear element such as an amplifier is connected to the filter circuit 1A, and the communication signal in the frequency band CH(n) is distorted by the non-linear element to generate distortion components in the frequency band CH(n−1) or the frequency band CH(n+1), such distortion components can be sufficiently attenuated by the filter circuit 1A.

Figure 2C:
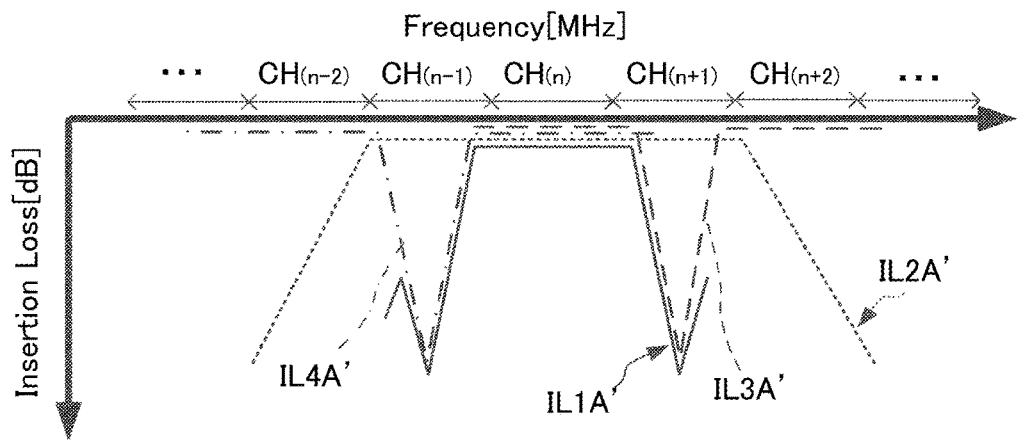

FIG. 2C is a bandpass characteristics diagram schematically illustrating the characteristics of the filter circuit 1A according to another exemplary configuration of the second embodiment of the present disclosure. A solid line in FIG. 2C is a schematic representation of the bandpass characteristics IL1A' of the filter circuit 1A. A dotted line in FIG. 2C is a schematic representation of the bandpass characteristics IL2A' of the fixed filter 2. A wavy line in FIG. 2C is a schematic representation of the bandpass characteristics IL3A' of the first tunable filter 3. An alternate long and short dashed line in FIG. 2C is a schematic representation of the bandpass characteristics IL4A' of the second tunable filter 4.

The bandpass characteristics IL2A' of the fixed filter 2 feature a wide pass band that extends over the (n−1)-th frequency band CH(n−1), the n-th frequency band CH(n), and the (n+1)-th frequency band CH(n+1). The bandpass characteristics IL3A' of the first tunable filter 3 and the bandpass characteristics IL4A' of the second tunable filter 4 each feature a stop band that is narrower than the pass band of the fixed filter 2 and whose center frequency is tunable. The stop band in the bandpass characteristics IL3A' has a center frequency that is adjustable in the vicinity of the high frequency side of the pass band of the fixed filter 2, and the stop band in the bandpass characteristics IL4A' has a center frequency that is adjustable in the vicinity of the low frequency side of the pass band of the fixed filter 2.

The above-mentioned bandpass characteristics IL1' of the filter circuit 1A allow the frequency band CH(n−1), the frequency band CH(n), or the frequency band CH(n+1) to be selected as the pass band by adjusting the first tunable filter 3 or the second tunable filter 4. Further, use of the first tunable filter 3 or the second tunable filter 4 allows for increased attenuation in a frequency band adjacent to the selected frequency band.

Next, a more specific example of the filter circuit 1A according to the second embodiment will be described.

The fixed filter 2 included in the filter circuit 1A is implemented as, for example, a SAW filter with bandpass-type characteristics. Alternatively, the fixed filter 2 may be also implemented as a filter such as an LC filter including an inductor and a capacitor, or a dielectric filter including a dielectric resonator.

Figure 3A:
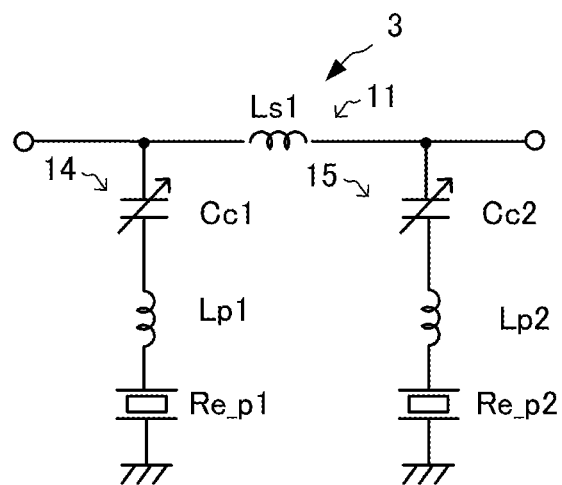
FIGS. 3A and 3B are circuit diagrams of tunable filters according to an example.
Figure 3B:
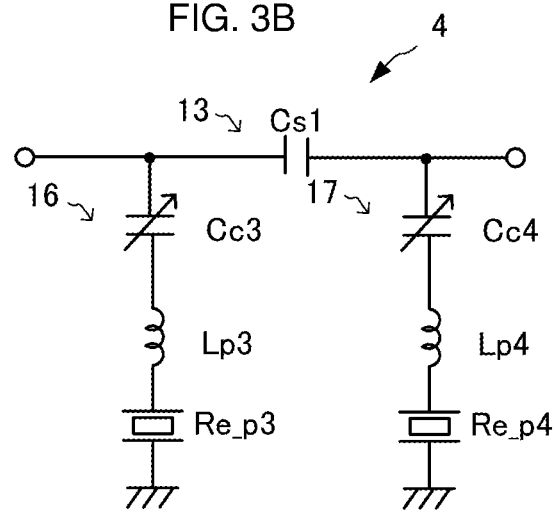

The first tunable filter 3 and the second tunable filter 4 included in the filter circuit 1A have the following circuit configurations. FIG. 3A is a circuit diagram illustrating an exemplary circuit configuration of the first tunable filter 3. FIG. 3B is a circuit diagram illustrating an exemplary circuit configuration of the second tunable filter 4.

The first tunable filter 3 includes a series arm 11 and parallel arms 14 and 15. The second tunable filter 4 includes a series arm 13 and parallel arms 16 and 17. The series arms 11 and 13 are each connected in series to a signal line. The parallel arms 14 and 15 are each connected at one end to each end of the series arm 11, and connected at the other end to the ground. The parallel arms 16 and 17 are each connected at one end to each end of the series arm 13, and connected at the other end to the ground. Thus, the first tunable filter 3 and the second tunable filter 4 are each implemented as a π-type circuit. The first tunable filter 3 and the second tunable filter 4 are indirectly or directly connected to each other via a matching circuit.

The series arm 11 includes an inductor Ls1. The series arm 13 includes a capacitor Cs1. The inductor Ls1 and the capacitor Cs1 are each connected in series to the signal line.

The parallel arm 14 includes a resonator Re_p1, an inductor Lp1, and a variable capacitor Cc1. The variable capacitor Cc1 is connected at one end to the inductor Ls1, and connected at the other end to the inductor Lp1. The inductor Lp1 is connected at one end to the variable capacitor Cc1, and connected at the other end to the resonator Re_p1. The resonator Re_p1 is connected at one end to the inductor Lp1, and connected at the other end to a ground terminal. That is, the resonator Re_p1, the inductor Lp1, and the variable capacitor Cc1 are connected in series between one end of the inductor Ls1 and the ground terminal.

The parallel arm 15 includes a resonator Re_p2, an inductor Lp2, and a variable capacitor Cc2. The variable capacitor Cc2 is connected at one end to the inductor Ls1, and connected at the other end to the inductor Lp2. The inductor Lp2 is connected at one end to the variable capacitor Cc2, and connected at the other end to the resonator Re_p2. The resonator Re_p2 is connected at one end to the inductor Lp2, and connected at the other end to a ground terminal. That is, the resonator Re_p2, the inductor Lp2, and the variable capacitor Cc2 are connected in series between the other end of the inductor Ls1 and the ground terminal.

The parallel arm 16 includes a resonator Re_p3, an inductor Lp3, and a variable capacitor Cc3. The variable capacitor Cc3 is connected at one end to the capacitor Cs1, and connected at the other end to the inductor Lp3. The inductor Lp3 is connected at one end to the variable capacitor Cc3, and connected at the other end to the resonator Re_p3. The resonator Re_p3 is connected at one end to the inductor Lp3, and connected at the other end to the ground terminal. That is, the resonator Re_{13} p3, the inductor Lp3, and the variable capacitor Cc3 are connected in series between one end of the capacitor Cs1 and the ground terminal.

The parallel arm 17 includes a resonator Re_p4, an inductor Lp4, and a variable capacitor Cc4. The variable capacitor Cc4 is connected at one end to the capacitor Cs1, and connected at the other end to the inductor Lp4. The inductor Lp4 is connected at one end to the variable capacitor Cc4, and connected at the other end to the resonator Re_p4. The resonator Re_p4 is connected at one end to the inductor Lp4, and connected at the other end to the ground terminal. That is, the resonator Re_p4, the inductor Lp4, and the variable capacitor Cc4 are connected in series between the other end of the capacitor Cs1 and the ground terminal.

As the resonators Re_p1, Re_p2, Re_p3, and Re_p4, piezoelectric resonators such as SAW resonators or BAW resonators, dielectric coaxial resonators, LC resonant circuits, or other resonators or resonant circuits may be used. As the variable capacitors Cc1, Cc2, Cc3, and Cc4, circuits or elements with variable inductance may be also used. The elements used as the inductor Ls1, the capacitor Cs1, and the inductors Lp1, Lp2, Lp3, and Lp4, and their characteristics may be set as appropriate.

The following description illustrates the general functions of reactance elements (the capacitor Cs1 and the inductor Ls1) in the respective series arms of the first tunable filter 3 and the second tunable filter 4. In the following description, it is assumed that the resonator Re_p1 and the resonator Re_p2 have the same resonance characteristics, and the resonator Re_p3 and the resonator Re_p4 have the same resonance characteristics.

Figure 4A:
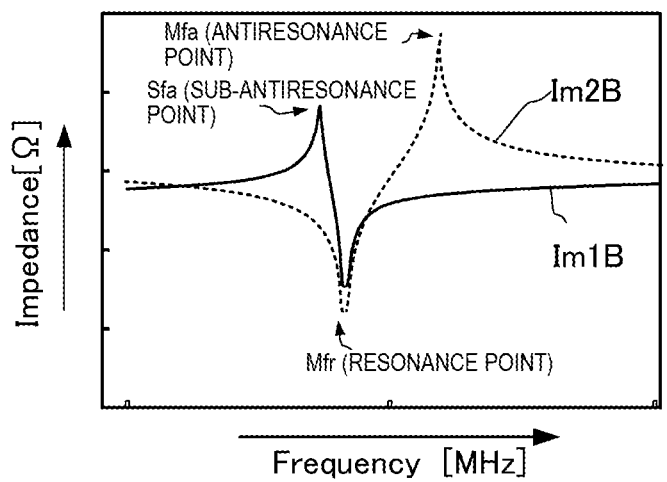
FIGS. 4A and 4B are characteristics diagrams for explaining the functions of tunable filters according to an example.

FIG. 4A illustrates the impedance characteristics of a circuit connecting a resonator and a reactance element. A solid line in FIG. 4A indicates the impedance characteristics Im1B of a circuit connecting the inductor Ls1 and the resonator Re_p1 or the resonator Re_p2. A dotted line in FIG. 4A indicates the impedance characteristics Im2B of a circuit connecting the capacitor Cs1 and the resonator Re_p3 or the resonator Re_p4.

If the inductor Ls1 is connected to a resonator, a new antiresonance point Sfa can be created on the low frequency side of a resonance point Mfr through appropriate adjustment of the inductor Ls1, as indicated by the impedance characteristics Im1B. If the capacitor Cs1 is connected to a resonator, a new antiresonance point Mfa can be created on the high frequency side of the resonance point Mfr through appropriate adjustment of the capacitor Cs1, as indicated by the impedance characteristics Im2B.

Figure 4B:
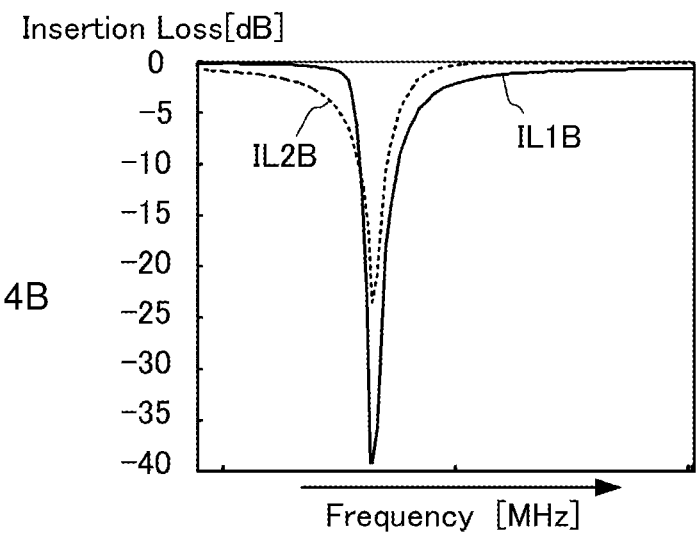

FIG. 4B illustrates the respective bandpass characteristics of the first and second tunable filters 3 and 4 with the variable capacitors Cc1, Cc2, Cc3, and Cc4 and the inductors Lp1, Lp2, Lp3, and Lp4 omitted. A solid line in FIG. 4B indicates the bandpass characteristics IL1B of the first tunable filter 3. A dotted line in FIG. 4B indicates the bandpass characteristics IL2B of the second tunable filter 4.

The bandpass characteristics IL1B of the first tunable filter 3 feature a stop band, and a pass band located on the low frequency side of the stop band, with steep attenuation in the region from the pass band located on the low frequency side of the stop band to the stop band. The bandpass characteristics IL2B of the second tunable filter 4 feature a stop band, and a pass band located on the high frequency side of the stop band, with steep attenuation in the region from the pass band located on the high frequency side of the stop band to the stop band.

As described above, the first tunable filter 3 or the second tunable filter 4 is constructed as a π-type circuit, and the reactance element provided in the series arm 11 or 13 of the corresponding tunable filter is configured as a capacitive or inductive reactance element as appropriate. This configuration allows for steep attenuation characteristics on the high or low frequency side of the stop band. Accordingly, the filter circuit 1A achieves increased steepness on both the low and high frequency sides of the pass band by employing the following configurations: the first tunable filter 3, which creates a stop band on the high frequency side of the pass band, has an inductive reactance inserted in the series arm so as to increase steepness on the side of the stop band near the pass band, that is, on the low frequency side of the stop band; and the second tunable filter 4, which creates a stop band on the low frequency side of the pass band, has a capacitive reactance inserted in the series arm so as to increase steepness on the side of the stop band near the pass band, that is, on the high frequency side of the stop band.

Another circuit element may be used as the inductor Ls1 as long as the circuit element has an inductive reactance in the vicinity of the stop band being set. For example, a resonator has an inductive reactance in the frequency band between the resonance point and the antiresonance point. Hence, the resonator to be used may have characteristics such that the stop band to be set lies in the frequency band between the resonance point and the antiresonance point. Further, another circuit element may be used as the capacitor Cs1 as long as the circuit element has a capacitive reactance in the vicinity of the stop band being set. For example, a resonator has a capacitive reactance in frequency bands outside of the frequency band between the resonance point and the antiresonance point. Hence, the capacitor to be used may have characteristics such that the stop band to be set lies outside of the frequency band between the resonance point and the antiresonance point.

Next, the general functions of the inductors Lp1, Lp2, Lp3, and Lp4 in the first tunable filter 3 and the second tunable filter 4 will be described.

Figure 5A:
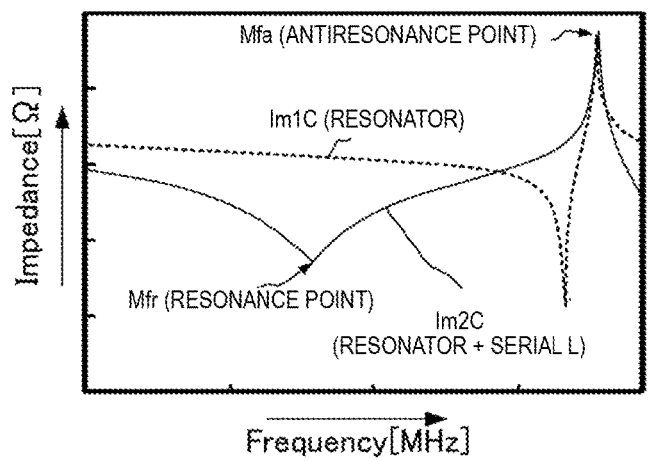
FIGS. 5A-5C are characteristics diagrams for explaining the functions of tunable filters according to an example.

FIG. 5A illustrates the impedance characteristics of a circuit connecting the inductor Lp1 and the resonator Re_p1. The dotted line in FIG. 5A indicates the impedance characteristics Im1C of the resonator Re_p1. A solid line in FIG. 5A indicates the impedance characteristics Im2C of a circuit connecting the inductor Lp1 and the resonator Re_p1.

As illustrated in FIG. 5A, a comparison between the impedance characteristics Im2C of the resonator Re_p1 with the inductor Lp1 provided, and the impedance characteristics Im1C of the resonator Re_p1 with the inductor Lp1 omitted indicates that although the antiresonance point Mfa is the same between the impedance characteristics Im2C and Im1C, the resonance point Mfr in the impedance characteristics Im2C moves further toward lower frequencies relative to the resonance point Mfr in the impedance characteristics Im1C.

As described above, the inductor Lp1 has the following function with respect to the impedance characteristics. That is, the inductor Lp1 causes the resonance point Mfr of the resonator Re_p1 to move further toward lower frequencies, thus increasing the frequency interval between the resonance point Mfr and the antiresonance point Mfa. Likewise, with respect to the impedance characteristics, the inductors Lp2, Lp3, and Lp4 have the function of causing the respective resonance points Mfr of the resonators Re_p2, Re_p3, and Re_p4 to move further toward lower frequencies, thus increasing the frequency interval between the resonance point Mfr and the antiresonance point Mfa.

Next, the general functions of the variable capacitors Cc1, Cc2, Cc3, and Cc4 in the first tunable filter 3 and the second tunable filter 4 will be described.

Figure 5B:
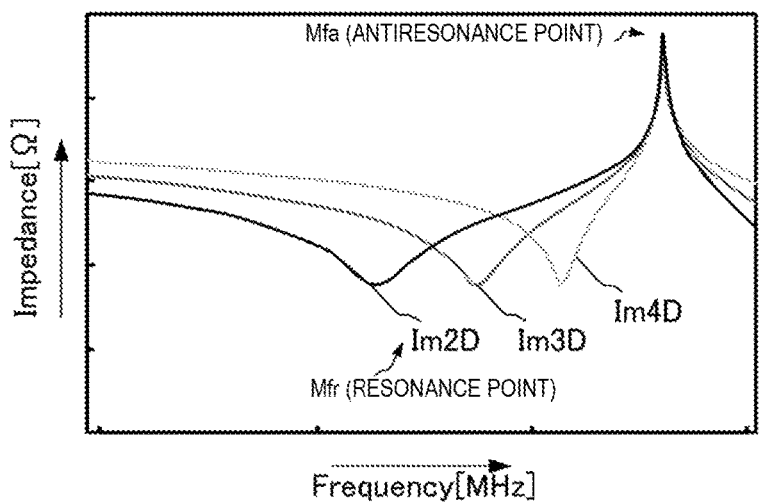

FIG. 5B illustrates the impedance characteristics of a circuit connecting the variable capacitor Cc1, the inductor Lp1, and the resonator Re_p1. For impedance characteristics Im2D, Im3D, and Im4D each indicated by a solid line in FIG. 5B, the corresponding capacitance of the variable capacitor Cc1 is set to decrease in the stated order.

The impedance characteristics Im2D, Im3D, and Im4D indicate that, although the frequency at the antiresonance point Mfa is the same, the resonance point Mfr moves closer to the antiresonance point Mfa, that is, toward higher frequencies with decreases in the capacitance of the variable capacitor Cc1.

Figure 5C:
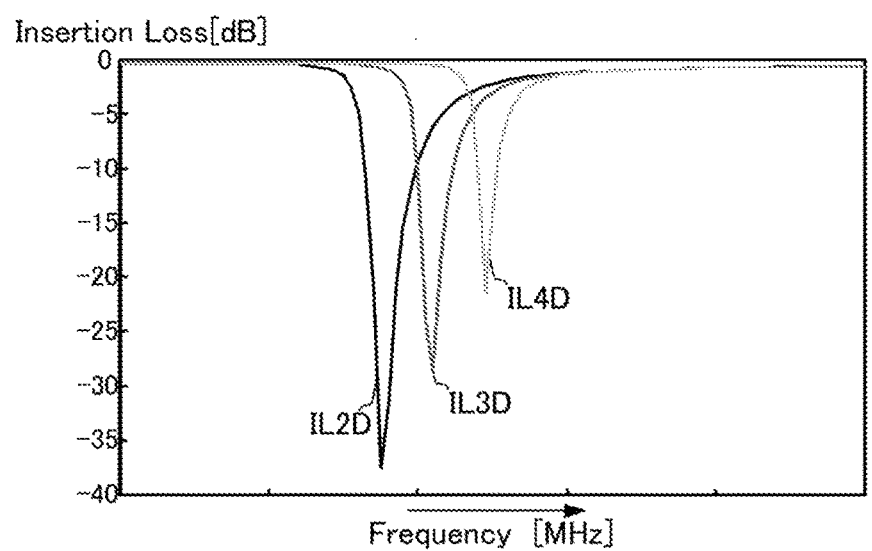

FIG. 5C illustrates the bandpass characteristics of the first tunable filter 3. For bandpass characteristics IL2D, IL3D, and IL4D each indicated by a solid line in FIG. 5C, the corresponding capacitances of the variable capacitors Cc1 and Cc2 are set to decrease in the stated order. The bandpass characteristics IL2D, IL3D, and IL4D indicate that the stop band moves toward higher frequencies with decreases in the capacitance of the variable capacitors Cc1 and Cc2.

It is to be noted, however, that even controlling the capacitances of the variable capacitors Cc1 and Cc2 to extremely small values does not allow the stop band to be adjusted to move toward higher frequencies beyond a predetermined frequency. This is due to the fact that, with respect to the impedance characteristics, it is impossible to move the frequency at the resonance point Mfr toward higher frequencies beyond the frequency at the antiresonance point Mfa. Hence, the frequency tuning range of the stop band is restricted to the band of frequencies that lies between the resonance point Mfr and the antiresonance point Mfa when the variable capacitors Cc1 and Cc2 are not provided. Therefore, when an inductor is connected in series to a resonator to widen the frequency band between the resonance point Mfr and the antiresonance point Mfa as illustrated in FIG. 5A, the frequency tuning range of the stop band can be widened.

As described above, in the first tunable filter 3, the variable capacitors Cc1 and Cc2 have the function of causing the respective resonance points Mfr of the resonators Re_p1 and Re_p2 or the stop band to move further toward higher frequencies. Similar changes in impedance characteristics and bandpass characteristics occur also in the second tunable filter 4. That is, in the second tunable filter 4 as well, the stop band moves toward higher frequencies with decreases in the capacitance of the variable capacitors Cc3 and Cc4, and hence the variable capacitors Cc3 and Cc4 have the function of causing the respective resonance points Mfr of the resonators Re_p3 and Re_p4 or the stop band to move further toward higher frequencies.

Figure 6A:
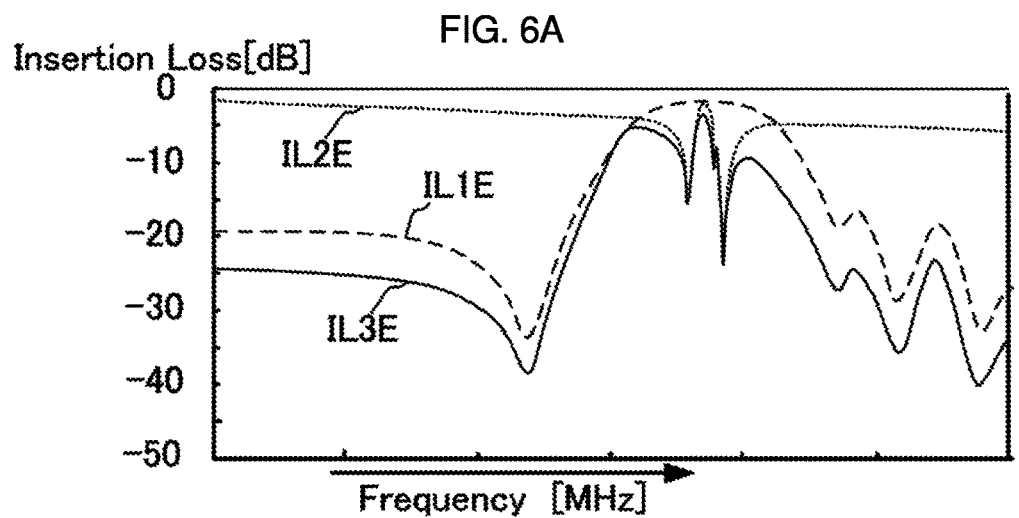
FIGS. 6A and 6B illustrate the bandpass characteristics of a filter circuit according to an example.
Figure 6B:
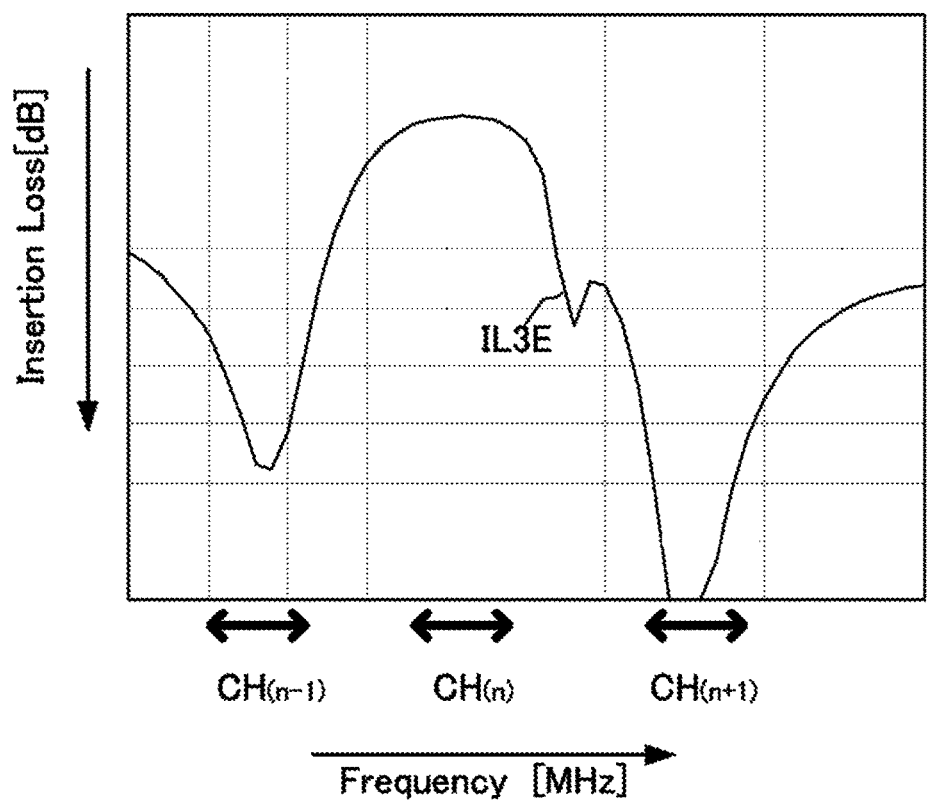

FIG. 6A is a bandpass characteristics diagram illustrating the bandpass characteristics of the filter circuit 1A and various filters. FIG. 6B is a bandpass characteristics diagram illustrating the vicinity of the pass band of the filter circuit 1A in enlarged form. FIG. 6A and FIG. 6B illustrate the bandpass characteristics of the filter circuit 1A and various filters. A solid line in FIG. 6A indicates the bandpass characteristics IL3E of the filter circuit 1A. A dotted line in FIG. 6A indicates bandpass characteristics IL2E obtained by combining the bandpass characteristics of the first tunable filter 3 and the bandpass characteristics of the second tunable filter 4. A dashed line in FIG. 6A indicates the bandpass characteristics IL1E of the fixed filter 2.

With respect to the combined bandpass characteristics IL2E of the first tunable filter 3 and the second tunable filter 4, the stop band is adjusted to overlap with each of the frequency band CH(n+1) and the frequency band CH(n−1) that are adjacent to the frequency band CH(n). Again, the resulting bandpass characteristics IL1E of the filter circuit 1A feature a pass band tuned to the frequency band CH(n), while allowing for increased steepness in the region from the frequency band CH(n) to the frequency band CH(n−1) located on the low frequency side, as well as increased steepness in the region from the frequency band CH(n) to the frequency band CH(n+1) located on the high frequency side.

As described above, the filter circuit 1A according to the second embodiment allows the stop bands on the high and low frequency sides of the pass band to be adjusted by individually controlling the variable capacitors Cc1, Cc2, Cc3, and Cc4, enabling control of the band width and center frequency of the pass band. The presence of the capacitor Cs1 or the inductor Ls1 allows for steeper attenuation characteristics on the low or high frequency side of the pass band. The presence of the inductors Lp1, Lp2, Lp3, and Lp4 allows for increased frequency tuning range of the stop band. The above-mentioned configuration of the filter circuit 1A leads to reduced number of variable capacitors for the circuit as a whole, thus minimizing increases in circuit scale.

Third Embodiment

Figure 7A:
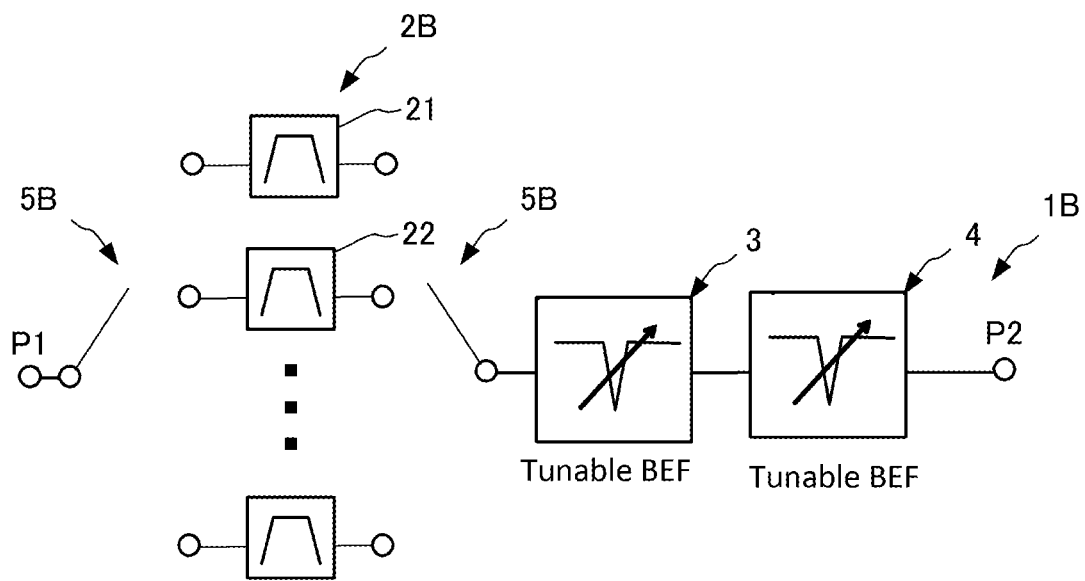
FIGS. 7A and 7B illustrate a block diagram and a schematic characteristics diagram of a filter circuit according to a third embodiment.

FIG. 7A is a circuit diagram illustrating a filter circuit 1B according to a third embodiment of the present disclosure.

The filter circuit 1B includes multiple fixed filters 2B, a first tunable filter 3, a second tunable filter 4, and a switch 5B. The respective pass bands of the fixed filters 2B differ from each other. The switch 5B selects one of the fixed filters 2B, and connects the selected fixed filter to the first tunable filter 3 and the second tunable filter 4.

Figure 7B:
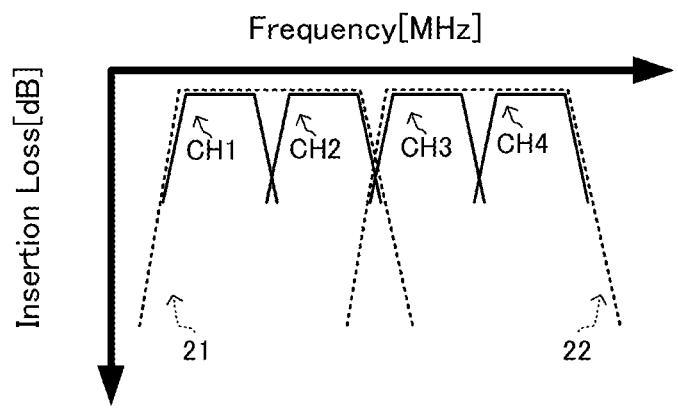

FIG. 7B is a conceptual diagram for explaining the function of the switch 5B of the filter circuit 1B.

The following description assumes that the fixed filters 2B include a fixed filter 21 and a fixed filter 22. The fixed filter 21 has a pass band including a frequency band CH1 and a frequency band CH2 among frequency bands CH1, CH2, CH3, and CH4 that are defined from the low frequency side to the high frequency side. The fixed filter 22 has a pass band including the frequency band CH3 and the frequency band CH4.

When the filter circuit 1B is controlled to have a pass band including only the frequency band CH1, the fixed filter 21 is selected by the switch 5B, and the first tunable filter 3 is controlled such that its stop band lies adjacent to and on the high frequency side of the frequency band CH1. Further, the second tunable filter 4 is controlled such that its stop band lies adjacent to and on the low frequency side of the frequency band CH1. This results in the pass band of the filter circuit 1B including only the frequency band CH1, with steep attenuation characteristics obtained on both the high and low frequency sides of the frequency band CH1.

When the filter circuit 1B is controlled to have a pass band including only the frequency band CH2, the fixed filter 21 is selected by the switch 5B, and the first tunable filter 3 is controlled such that its stop band lies adjacent to and on the high frequency side of the frequency band CH2. Further, the second tunable filter 4 is controlled such that its stop band lies adjacent to and on the low frequency side of the frequency band CH2. This results in the pass band of the filter circuit 1B including only the frequency band CH2, with steep attenuation characteristics obtained on both the high and low frequency sides of the frequency band CH2.

When the filter circuit 1B is controlled to have a pass band including only the frequency band CH3, the fixed filter 22 is selected by the switch 5B, and the first tunable filter 3 is controlled such that its stop band lies adjacent to and on the high frequency side of the frequency band CH3. Further, the second tunable filter 4 is controlled such that its stop band lies adjacent to and on the low frequency side of the frequency band CH3. This results in the pass band of the filter circuit 1B including only the frequency band CH3, with steep attenuation characteristics obtained on both the high and low frequency sides of the frequency band CH3.

When the filter circuit 1B is controlled to have a pass band including only the frequency band CH4, the fixed filter 22 is selected by the switch 5B, and the first tunable filter 3 is controlled such that its stop band lies adjacent to and on the high frequency side of the frequency band CH4. Further, the second tunable filter 4 is controlled such that its stop band lies adjacent to and on the low frequency side of the frequency band CH4. This results in the pass band of the filter circuit 1B including only the frequency band CH4, with steep attenuation characteristics obtained on both the high and low frequency sides of the frequency band CH4.

Fourth Embodiment

Figure 8:
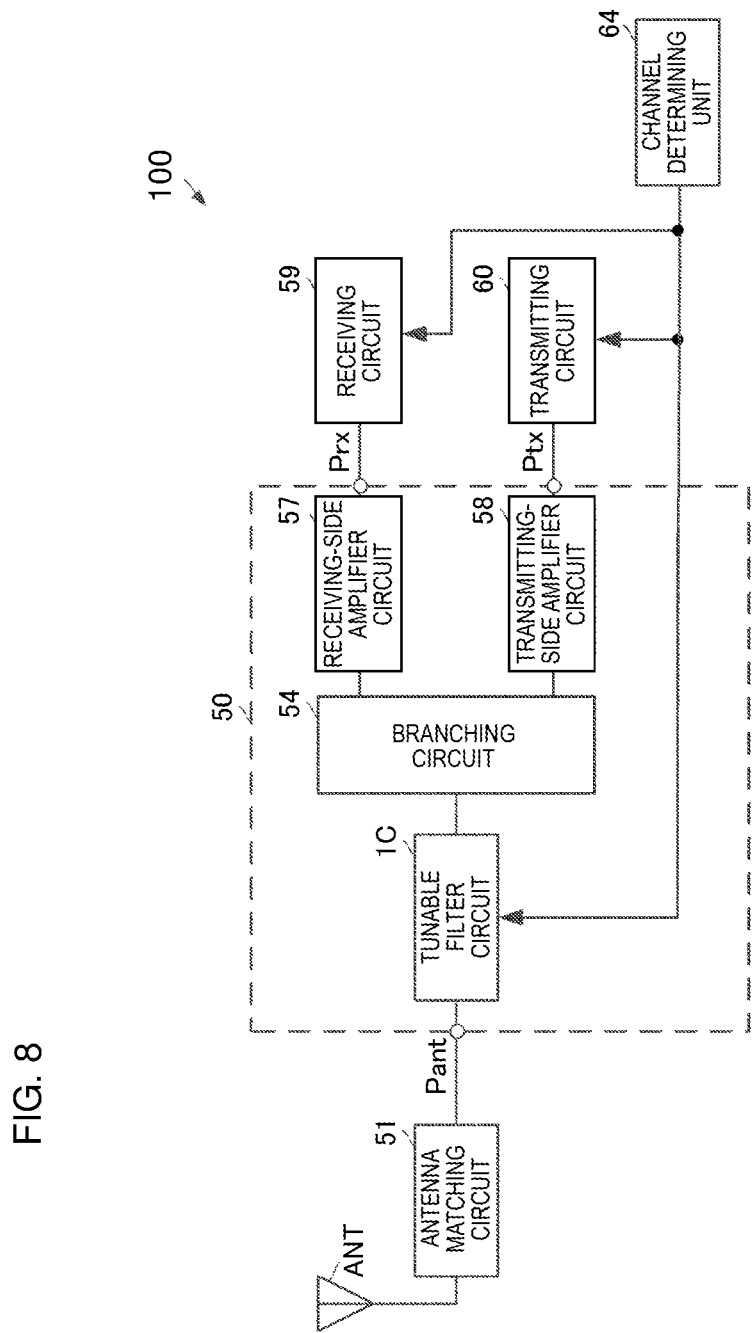
FIG. 8 is a circuit diagram of a communication apparatus and an RF front end circuit according to a fourth embodiment.

FIG. 8 is a circuit diagram illustrating a communication apparatus 100 and an RF front end circuit 50 according to a fourth embodiment of the present disclosure.

The communication apparatus 100 includes an antenna matching circuit 51, the RF front end circuit 50, a receiving circuit 59, a transmitting circuit 60, and a channel determining unit 64.

The RF front end circuit 50 includes an antenna connection end Pant, a receiving-circuit connection end (signal-processing-circuit connection end) Prx, and a transmitting-circuit connection end (signal-processing-circuit connection end) Ptx. The antenna matching circuit 51 is connected between an antenna ANT and the antenna connection end Pant. The antenna ANT is used for both transmission and reception in this case. The RF front end circuit 50 has the function of branching a transmit signal and a receive signal toward the receiving-circuit connection end Prx or the transmitting-circuit connection end Ptx. The receiving circuit 59 is connected to the receiving-circuit connection end Prx, and performs signal processing on the receive signal. The transmitting circuit 60 is connected to the transmitting-circuit connection end Ptx, and performs signal processing on the transmit signal. The receiving circuit 59 and the transmitting circuit 60 each correspond to a signal processing circuit according to the fourth embodiment.

The RF front end circuit 50 includes a tunable filter circuit 1C, a branching circuit 54, a receiving-side amplifier circuit 57, and a transmitting-side amplifier circuit 58. The tunable filter circuit 1C is used as an antenna tuner in this case. The tunable filter circuit 1C has a configuration similar to that of the filter circuit according to each of the above-mentioned embodiments, and has the function of selecting the communication band (channel) of each of transmit and receive signals. The branching circuit 54 is either a circuit made up solely of a component such as a duplexer, a diplexer, a circulator, or a switchplexer, or a composite circuit of these components. The branching circuit 54 has the function of separating a transmit signal and a receive signal from each other. The receiving-side amplifier circuit 57 is, for example, a low noise amplifier, and has the function of amplifying a receive signal. The transmitting-side amplifier circuit 58 is, for example, a power amplifier, and has the function of amplifying a transmit signal. The RF front end circuit 50 may be configured not to include some or all of the branching circuit 54, the transmitting-side amplifier circuit 58, and the receiving-side amplifier circuit 57.

The channel determining unit 64 acquires a map of free channels from an external database or other data source, and detects a free channel based on the map. The channel determining unit 64 selects at least one free communication channel, and sets the selected channel for the transmitting circuit 60, the receiving circuit 59, and the tunable filter circuit 1C. The transmitting circuit 60 generates a baseband transmit signal, modulates the baseband transmit signal to the frequency signal of the channel set by the channel determining unit 64, and outputs the resulting signal to the RF front end circuit 50. The receiving circuit 59 demodulates the receive signal output from the RF front end circuit 50 into a baseband signal by using a local signal based on the channel set by the channel determining unit 64. A tunable filter inside the tunable filter circuit 1C is adjusted such that a channel adjacent to the channel set by the channel determining unit 64 becomes the stop band.

This configuration allows the communication apparatus 100 and the RF front end circuit 50 to transmit and receive a communication signal by using a free channel in a communication band made up of multiple channels. For example, the RF front end circuit 50 transmits and receives a communication signal based on the specifications of TV white space. According to the specifications of TV white space, among multiple channels defined in the UHF band used for television broadcasting, that is, the communication band from 470 [MHz] to 790 [MHz], and each having a frequency band width of 6 [MHz], a channel on which a television broadcasting signal is not being transmitted is used as a free channel.

The communication apparatus 100 and the RF front end circuit 50 according to the present disclosure can be configured as described above. In addition to the ability to control the range of frequencies to be passed as the pass band, the tunable filter circuit 1C provides increased attenuation/steepness at frequencies located in the vicinity of and on the low frequency side or/and high frequency side of the pass band being selected. As a consequence, even in a TV white space in which multiple communication bands (channels) lie adjacent to each other, the communication apparatus 100 and the RF front end circuit 50 are able to perform communication by using a free channel while avoiding interference with communication signals in adjacent bands.

The present invention can be implemented as described above with reference to the embodiments. It is to be noted that the present invention may be implemented in any configuration other than those of the embodiments or modifications mentioned above, as long as such configuration falls within the scope of the present invention. For example, the specific circuit configuration of the tunable filter may be other than the configuration mentioned above.

REFERENCE SIGNS LIST 1, 1A, 1B, 1C filter circuit
2, 2B, 21, 22 fixed filter
3 first tunable filter
4 second tunable filter
5B switch
11, 13 series arm
14, 15, 16, 17 parallel arm
50 RF front end circuit
51 antenna matching circuit
54 branching circuit
57 receiving-side amplifier circuit
58 transmitting-side amplifier circuit
59 receiving circuit
60 transmitting circuit
64 channel determining unit
100 communication apparatus

The invention claimed is:

1. A filter circuit comprising:
a fixed filter having a pass band that overlaps with a frequency band corresponding to a predetermined communication signal; and
a tunable filter having a stop band that is frequency-tunable, the stop band having a frequency tuning range that covers a frequency band adjacent to the frequency band corresponding to the predetermined communication signal,
wherein the fixed filter and the tunable filter are connected in series,
wherein the tunable filter comprises a first tunable filter and a second tunable filter,
wherein the first tunable filter has a stop band, the stop band having a frequency tuning range that covers a frequency band located adjacent to and on a high frequency side of the frequency band corresponding to the predetermined communication signal, and
wherein the second tunable filter has a stop band, the stop band having a frequency tuning range that covers a frequency band located adjacent to and on a low frequency side of the pass band of the fixed filter.

2. The filter circuit according to claim 1,
wherein the pass band of the fixed filter has a band width wider than a band width of the frequency band corresponding to the predetermined communication signal, and
wherein the respective stop bands of the first and second tunable filters have a band width narrower than the band width of the pass band of the fixed filter.

3. The filter circuit according to claim 2,
wherein the fixed filter comprises a plurality of fixed filters having different pass bands, and
wherein the filter circuit further comprises a switch that selects one of the fixed filters and connects the selected one of the fixed filters to the tunable filter.

4. The filter circuit according to claim 2,
wherein the fixed filter has a pass band that extends over two or more channels, and
wherein the first and second tunable filters are frequency-tunable within the pass band.

5. The filter circuit according to claim 1,
wherein the first tunable filter has a steepness that is higher on a low frequency side of the stop band than on a high frequency side of the stop band, and
wherein the second tunable filter has a steepness that is higher on a high frequency side of the stop band than on a low frequency side of the stop band.

6. The filter circuit according to claim 5,
wherein the pass band of the fixed filter includes a frequency band corresponding to each of a plurality of communication signals,
wherein the stop band of the first tunable filter is frequency-tunable over a frequency band located adjacent to and on a high frequency side of the frequency band to which each of the communication signals corresponds, and
wherein the stop band of the second tunable filter is frequency-tunable over a frequency band located adjacent to and on a low frequency side of the frequency band to which each of the communication signals corresponds.

7. The filter circuit according to claim 5,
wherein the fixed filter comprises a plurality of fixed filters having different pass bands, and
wherein the filter circuit further comprises a switch that selects one of the fixed filters and connects the selected one of the fixed filters to the tunable filter.

8. The filter circuit according to claim 5,
wherein the fixed filter has a pass band that extends over two or more channels, and
wherein the first and second tunable filters are frequency-tunable within the pass band.

9. The filter circuit according to claim 1,
wherein the pass band of the fixed filter includes a frequency band corresponding to each of a plurality of communication signals,
wherein the stop band of the first tunable filter is frequency-tunable over a frequency band located adjacent to and on a high frequency side of the frequency band to which each of the communication signals corresponds, and
wherein the stop band of the second tunable filter is frequency-tunable over a frequency band located adjacent to and on a low frequency side of the frequency band to which each of the communication signals corresponds.

10. The filter circuit according to claim 9,
wherein the fixed filter comprises a plurality of fixed filters having different pass bands, and
wherein the filter circuit further comprises a switch that selects one of the fixed filters and connects the selected one of the fixed filters to the tunable filter.

11. The filter circuit according to claim 1,
wherein the fixed filter comprises a plurality of fixed filters having different pass bands, and
wherein the filter circuit further comprises a switch that selects one of the fixed filters and connects the selected one of the fixed filters to the tunable filter.

12. The filter circuit according to claim 1,
wherein the fixed filter has a pass band that extends over two or more channels, and
wherein the first and second tunable filters are frequency-tunable within the pass band.

13. The filter circuit according to claim 12,
wherein the filter circuit is adapted to a system that performs radio communication of the predetermined communication signal by selecting a free channel from among a plurality of channels existing in a specific frequency band.

14. The filter circuit according to claim 13,
wherein the system comprises a radio communication system utilizing a TV white space,
wherein the specific frequency band comprises a frequency band used for television broadcasting, and
wherein each of the channels comprises a channel used for television broadcasting.

15. The filter circuit according to claim 14,
wherein the frequency band used for television broadcasting is a communication band from 470 MHz to 790 MHz, and each of the channels has a frequency band width of 6 MHz.

16. An RF front end circuit comprising:
the filter circuit according to claim 1;
an antenna connection end located on one end side of the filter circuit; and
a signal-processing-circuit connection end located on another end side of the filter circuit.

17. A communication apparatus comprising:
the RF front end circuit according to claim 16;
an antenna connected to the antenna connection end; and
a signal processing circuit connected to the signal-processing-circuit connection end.

* * * * *

UNITED STATES PATENT AND TRADEMARK OFFICE
CERTIFICATE OF CORRECTION

PATENT NO. : 10,340,874 B2
APPLICATION NO. : 15/583198
DATED : July 2, 2019
INVENTOR(S) : Atsushi Horita It is certified that error appears in the above-identified patent and that said Letters Patent is hereby corrected as shown below:

In the Specification

Column 6, Line 63, "characteristics IL1'" should read -- characteristics IL1A' --

Signed and Sealed this
Fifteenth Day of September, 2020

Andrei Iancu
*Director of the United States Patent and Trademark Office*